(12) United States Patent
Mallett

(10) Patent No.: US 9,666,343 B2
(45) Date of Patent: May 30, 2017

(54) MAGNETIC FIELD CONTROL

(71) Applicant: HTS-110 Limited, Lower Hutt (NZ)

(72) Inventor: Michael John Disney Mallett, Lower Hutt (NZ)

( * ) Notice: Subject to any disclaimer, the term of this patent is extended or adjusted under 35 U.S.C. 154(b) by 0 days.

(21) Appl. No.: 15/242,668

(22) Filed: Aug. 22, 2016

(65) Prior Publication Data

US 2016/0358702 A1   Dec. 8, 2016

Related U.S. Application Data

(63) Continuation of application No. 14/419,778, filed as application No. PCT/NZ2013/000137 on Aug. 7, 2013, now abandoned.

(30) Foreign Application Priority Data

Aug. 7, 2012  (NZ) ........................................ 601676

(51) Int. Cl.
| | |
|---|---|
| G01R 29/08 | (2006.01) |
| G01R 33/02 | (2006.01) |
| H01F 6/00 | (2006.01) |
| G01R 33/00 | (2006.01) |
| G01R 33/035 | (2006.01) |
| G01R 33/07 | (2006.01) |
| G01R 33/09 | (2006.01) |
| G01R 33/24 | (2006.01) |
| H01F 6/06 | (2006.01) |

(52) U.S. Cl.
CPC ......... *H01F 6/008* (2013.01); *G01R 33/0041* (2013.01); *G01R 33/0354* (2013.01); *G01R 33/07* (2013.01); *G01R 33/093* (2013.01); *G01R 33/24* (2013.01); *H01F 6/06* (2013.01); *Y10T 307/549* (2015.04)

(58) Field of Classification Search
CPC .. G01R 33/041; G01R 33/0354; G01R 33/07; G01R 33/093; G01R 33/24
See application file for complete search history.

(56) References Cited

U.S. PATENT DOCUMENTS

| | | | |
|---|---|---|---|
| 5,631,561 A | 5/1997 | Stetter | |
| 5,689,185 A * | 11/1997 | Widdershoven | ....... G01R 33/09 324/247 |

(Continued)

FOREIGN PATENT DOCUMENTS

| | | |
|---|---|---|
| GB | 825137 | 12/1959 |
| GB | 1052821 | 12/1966 |

(Continued)

OTHER PUBLICATIONS

Extended European Search Report, European Application No. 13827064.0, Mar. 24, 2016, pp. 1-11.

*Primary Examiner* — Colleen Dunn
(74) *Attorney, Agent, or Firm* — Dann, Dorfman, Herrell and Skillman, P.C.

(57) ABSTRACT

An assembly for generating a superconducting magnetic field with high stability comprises a main power supply unit arranged to provide a main current to generate a superconducting magnetic field, a magnetic field measurement device for measuring the generated magnetic field, and an auxiliary power supply unit arranged to output an auxiliary current based on the measured magnetic field.

18 Claims, 2 Drawing Sheets

(56) References Cited

U.S. PATENT DOCUMENTS

| | | | |
|---|---|---|---|
| 6,208,497 B1 | 3/2001 | Seale et al. | |
| 6,816,046 B1 | 11/2004 | Varney | |
| 2004/0263162 A1 | 12/2004 | Kandori et al. | |
| 2007/0247141 A1* | 10/2007 | Pastre | G01R 33/0035 324/202 |
| 2010/0315928 A1* | 12/2010 | Zhou | G01R 33/098 369/53.38 |

FOREIGN PATENT DOCUMENTS

| | | |
|---|---|---|
| JP | 6480899 | 3/1989 |
| JP | 2002313624 | 10/2002 |
| JP | 2008020266 | 1/2008 |

\* cited by examiner

MAGNETIC FIELD CONTROL

CROSS REFERENCE TO RELATED APPLICATION

This application is a continuation of U.S. application Ser. No. 14/419,778, which was the National Stage of International Application PCT/NZ2013/000137, filed on Aug. 7, 2013, the entirety of which is incorporated herein by reference.

FIELD OF THE INVENTION

The invention relates to a superconducting circuit arranged to produce a stable and accurate superconducting magnetic field. The invention also relates to a method for generating a stable superconducting magnetic field and a method for stabilising a superconducting magnetic field.

BACKGROUND TO THE INVENTION

Due to thermal drift of the magnet or power supply, or flux creep in the superconducting main magnet coil, a magnetic field from a superconducting circuit may fluctuate or drift.

One approach to minimise deviations and improve the stability of the field generated is to include a field measurement device to measure the magnetic field value and feedback an error signal to the power supply (PSU). A disadvantage of this method is a relatively low level of accuracy and stability since the resolution of the main current PSU, which has an output current of typically 50-1000 A, is of the order of a few PPM and so provides a current output resolution of order 1 mA and so the magnetic field cannot be controlled to an accuracy of better than a few PPM. Another disadvantage is that the reaction time of the power supply is damped due to the stabilising circuitry associated with the DC current transducers.

An alternative approach is to include a passive, coupled, short-circuited inductor in the electrical circuit. The inductor opposes a change of the magnetic field within the magnet. This tends to dampen the change of the magnetic field and lower the magnetic field drift rate. However this method merely slows the rate of magnetic field drift without actually correcting it.

A separately driven 'shim' coil controlled by the error signal from the magnetic field measurement device may be provided. The 'shim' coil is typically a room temperature coil within the bore of the superconducting magnet, and can provide a small correction signal to control the magnetic field drift. A limitation is that the shim coil has a reduced response due to a low number of turns and therefore does not offer a sufficient amount of correction.

SUMMARY OF THE INVENTION

It is an object of the invention to provide a stable superconducting magnetic generating circuit, a method for stabilising a superconductor generating circuit, or to at least to provide the public with a useful choice.

In broad terms in one aspect the invention comprises an assembly for generating a superconducting magnetic field with high stability comprising a main power supply unit arranged to provide a main current to generate a superconducting magnetic field, a magnetic field measurement device for measuring or assessing the generated magnetic field, and an auxiliary power supply unit arranged to output an auxiliary current based on the measured magnetic field.

Preferably the main power supply unit is connected in parallel with the auxiliary power supply unit.

Preferably the magnetic field measurement device produces an error signal based on the measured magnetic field value and a predetermined magnetic field value.

Preferably the error signal is proportional to the difference between the measured magnetic field value and the predetermined magnetic field value.

Preferably the field measurement device comprises a nuclear magnetic resonance (NMR) probe and a detection circuit.

Alternatively the field measurement device comprises a pick up coil which produces an error signal based on the rate of change of the magnetic field indicating the difference between the measured magnetic field and a predetermined magnetic field value.

In another preferred embodiment the field measurement device is a Hall effect sensor, giant magnetoresistance (GMR) sensor, or superconducting quantum interference device (SQUID) sensor.

Preferably the error signal is conditioned by a PID function before it is input to the auxiliary power supply unit.

Preferably the auxiliary power supply unit has a maximum output current of about +/−0.01 to about 1%, 0.01 to 0.5%, or 0.01 to 0.1% of the output current of the main current unit.

Preferably the auxiliary power supply unit has a stability of better than 25 or better than 10 PPM (parts per million) per hour of its maximum output current.

Preferably the superconducting magnetic circuit comprises a high temperature superconductor (HTS) coil.

Alternatively, the superconducting magnetic circuit may comprise a low temperature superconductor (LTS) coil.

Preferably the assembly further comprises a DC current transformer (DCCT) to control the main power supply unit.

In broad terms in another aspect the invention comprises a method for generating a superconducting magnetic field comprising the following steps:
  providing a main current to a superconducting magnetic circuit to generate a magnetic field,
  measuring the generated magnetic field,
  providing an auxiliary current to the superconducting magnetic circuit based on the measured magnetic field value.

In broad terms in a third aspect the invention comprises a method for stabilising a superconducting magnetic field comprising measuring a generated magnetic field value, comparing the measured magnetic field value with a predetermined magnetic field value and calculating an error signal, supplying the error signal to an auxiliary power supply unit to produce a stabilising current, feeding the stabilising current to the superconducting magnetic field generating circuit to thereby stabilise the generated magnetic field.

The term "comprising" as used in this specification and claims means "consisting at least in part of". When interpreting each statement in this specification and claims that includes the term "comprising", features other than that or those prefaced by the term may also be present. Related terms such as "comprise" and "comprises" are to be interpreted in the same manner.

BRIEF DESCRIPTION OF THE DRAWINGS

Preferred embodiments of the invention will be described by way of example only and with reference to the drawings, in which.

DETAILED DESCRIPTION OF PREFERRED EMBODIMENTS

The invention relates to an assembly for generating a stable superconducting magnetic field.

Figure 1:
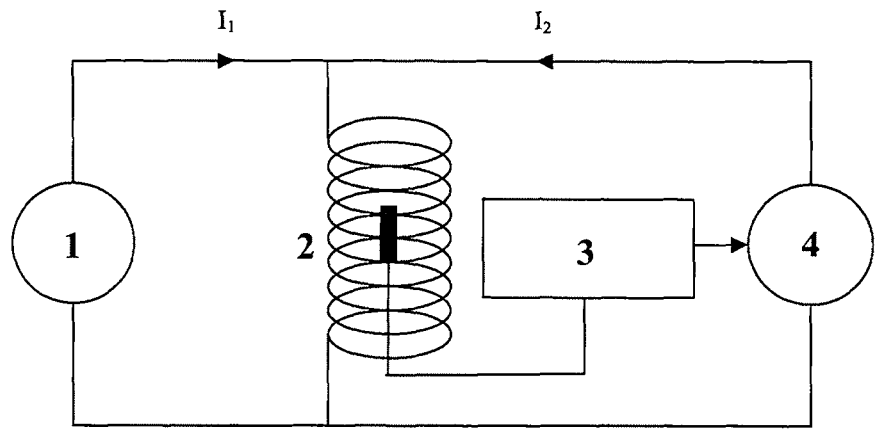
FIG. 1 is a schematic representation of a superconducting magnetic assembly employing one embodiment of the invention.
Figure 3:
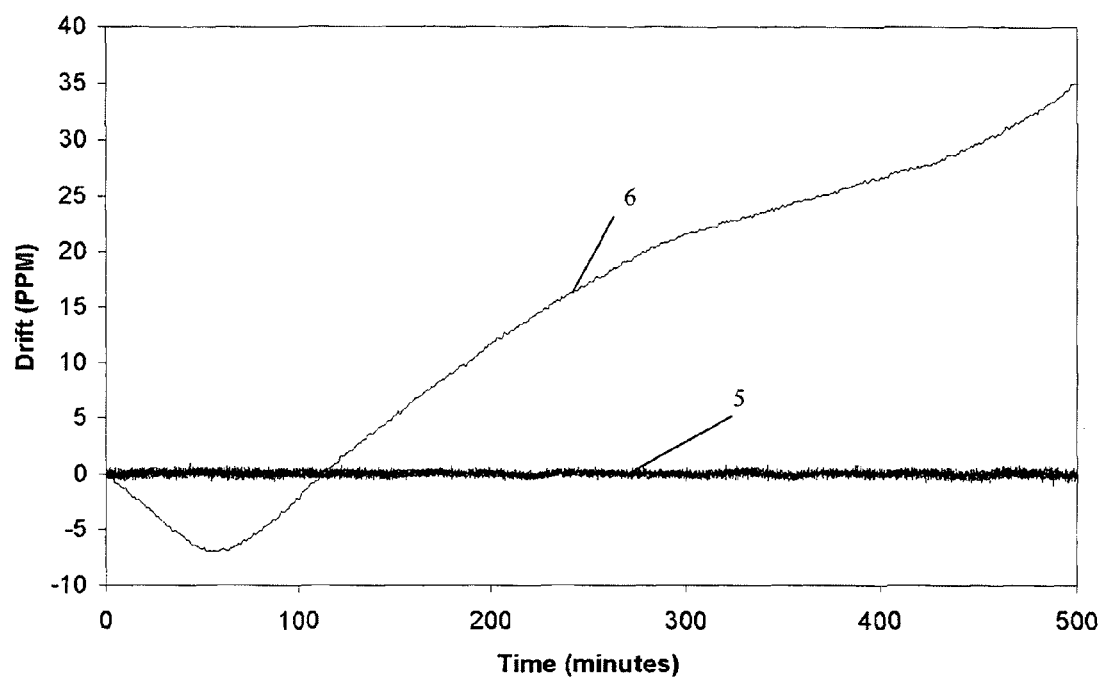
FIG. 3 shows a comparison of the magnetic field drift produced by an uncorrected system and a corrected system which incorporates the present invention to stabilise the magnetic field produced.

Referring to FIG. 1, the assembly comprises a main magnetic power supply unit 1 across the input terminals of a coil assembly 2. The main magnetic power supply unit 1 aims to provide a main current, typically in the range of 50-1000 Amps to the magnet coil 2. The stability of this main current is typically in a range of a few PPM per hour (parts per million). It is to be understood that magnet coil 2 is subject to a number of factors which would cause the magnetic field generated to drift irrespective of the stability of the main input current. Some of these factors include flux redistribution within the superconductor and thermal drift due to small changes in the dimensions of the magnet created by environmental temperature changes. As a result, the magnetic field stability can be no better than the stability of the output current from the main power supply unit 1. In long term operations, these magnetic field drifts may grow to a significant amount which could potentially cause serious problems. An example of such magnetic field drift is shown in FIG. 3. Curve 6 indicates the drift value continues to grow with time after 100 minutes and eventually can be higher than 30 PPM after 500 minutes.

Figure 2:
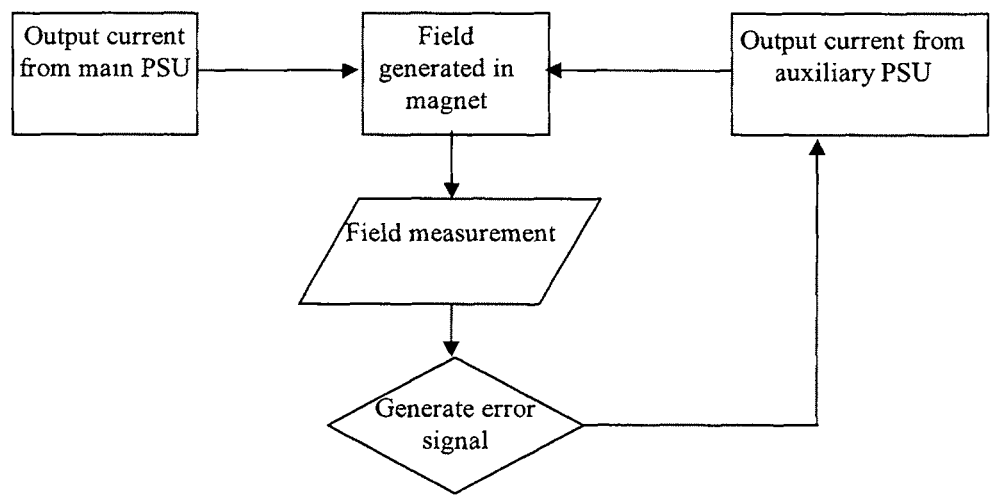
FIG. 2 shows a flow diagram of signal communication between each component of the magnetic assembly.

In accordance with the invention, FIG. 1 also shows a field measurement device 3 and an auxiliary power supply unit 4. The field measurement device provides a measurement of the magnetic field present in the magnet 2 and generates an error signal proportional to the drift of the magnetic field away from some predetermined value. This error signal is then fed into the auxiliary power supply unit 4. Preferably the auxiliary power supply unit 4 is a low current, low voltage power supply unit which is connected in parallel with the main magnetic power supply unit 1. Upon receiving the error signal which represents the value of the drift, the auxiliary power supply unit 4 provides a correction current to the magnet coil 2 to correct for such a drift. This is shown in FIG. 2.

In one preferred embodiment the error signal generated by the field measurement device is conditioned by a PID function before it is supplied to the auxiliary power supply unit. The PID function parameters may be optimised to the measured drift rate of the magnet to allow for accurate field control with minimal field oscillations which may be added to the magnetic field by changing the error signal input to the auxiliary power supply unit too rapidly.

In one preferred embodiment the field measurement device comprises an NMR probe and a detection circuit. It may further comprise a magnetically coupled pick up coil which provides an error signal to the auxiliary power supply unit 4 in response to the rate of the magnetic field drift. It may alternatively comprise a Hall effect sensor, GMR sensor, or SQUID sensor.

The auxiliary power supply unit provides a highly stable, but significantly lower current to the magnet 2. For example the auxiliary power supply unit may have a maximum output current of +/− about 0.01 to about 1%, or 0.01 to about 0.5%, or 0.01 to about 0.1% of the output current of the main current unit. The output current by the auxiliary power supply unit 4 is typically in the range of +/−100 milli amps. Preferably this current is proportional to the error signal generated by the field measurement device 3 and has stability typically better than 25 or 10 PPM per hour of the maximum output current of the auxiliary power supply unit.

In one preferred embodiment the magnet coil 2 is fabricated using a high temperature superconductor (HTS). Alternatively it could be fabricated using a low temperature superconductor (LTS).

The accuracy of the field measurement device can be of the order of PPB (parts per billion) when an NMR probe is employed. This is a few orders of magnitude smaller than the accuracy that may be achieved in the output current by feeding the error signal directly into the main power supply unit since the main output current can usually only be specified to be within a few PPM. The total current flowing through the magnet 2 can then be controlled, on average, to the accuracy of the secondary PSU, so the magnet current can be varied to an accuracy of better than PPB (parts per billion) and potentially to an accuracy of PPT (parts per trillion). Curve 5 in FIG. 3 for a thus corrected current illustrates this, relative to uncorrected curve 6.

Where in the foregoing description reference has been made to elements or integers having known equivalents, then such equivalents are included as if they were individually set forth. Although the invention has been described by way of example and with reference to particular embodiments, it is to be understood that modifications and/or improvements may be made without departing from the scope of the invention as defined in the accompanying claims.

The invention claimed is:

1. An assembly for generating a stable magnetic field comprising a main power supply unit arranged to provide a main direct current to a superconducting magnetic circuit to generate a superconducting magnetic field, a magnetic field measurement device for measuring the generated magnetic field, and an auxiliary power supply unit in parallel with the main power supply unit and arranged to output an auxiliary direct current to the superconducting magnetic circuit based on the measured magnetic field.

2. An assembly according to claim 1 wherein the magnetic field measurement device produces an error signal based on the measured magnetic field value and a predetermined magnetic field value.

3. An assembly according to claim 2 wherein the error signal is proportional to the difference between the measured magnetic field value and the predetermined magnetic field value.

4. An assembly according to claim 1 wherein the field measurement device comprises a nuclear magnetic resonance probe and a detection circuit.

5. An assembly according to claim 1 wherein the field measurement device comprises a pick up coil which produces an error signal, dependent upon the rate of change of the magnetic field, indicating the difference between the measured magnetic field and a predetermined magnetic field value.

6. An assembly according to claim 1 wherein the field measurement device is a Hall effect sensor, GMR sensor, or SQUID sensor.

7. An assembly according to claim 1 wherein the error signal is conditioned by a PID function before it is input to the auxiliary power supply unit.

8. An assembly according to claim 1 wherein the auxiliary power supply unit has a maximum output current of about +/−0.01 to about 1% of the output current of the main current unit.

9. An assembly according to claim 1 wherein the auxiliary power supply unit has a stability of better than 25 PPM (parts per million) per hour of its maximum output current.

10. An assembly according to claim 1 wherein the superconducting magnetic circuit comprises a high temperature superconductor coil.

11. An assembly according to claim 1 wherein the assembly further comprises a DC current transducer to control the main power supply unit.

12. A method for generating a stable superconducting magnetic field, comprising:
providing a main direct current to a superconducting magnetic circuit to generate a magnetic field,
measuring the generated magnetic field,
providing an auxiliary direct current in parallel to the superconducting magnetic circuit and based on the measured magnetic field value.

13. A method according to claim 12 including measuring the generated magnetic field and producing an error signal based on the measured magnetic field value and a predetermined magnetic field value.

14. A method according to claim 12 including measuring the generated magnetic field and producing an error signal based on the measured magnetic field value and a predetermined magnetic field value proportional to the difference between the measured magnetic field value and the predetermined magnetic field value.

15. A method according to claim 14 including conditioning the error signal is by a PID function before providing an auxiliary current to the superconducting magnetic circuit based.

16. A method according to claim 12 wherein the superconducting magnetic circuit comprises a high temperature superconductor coil.

17. A method according to claim 12 including controlling the main power supply unit via a DC current transducer.

18. A method for stabilising a superconducting magnetic field comprising measuring a generated magnetic field value, comparing the measured magnetic field value with a predetermined magnetic field value and calculating an error signal, supplying the error signal to an auxiliary power supply unit connected in parallel with a main power supply unit to produce a stabilising direct current, feeding the stabilising direct current to the superconducting magnetic field generating circuit to thereby stabilise the generated magnetic field.

* * * * *

UNITED STATES PATENT AND TRADEMARK OFFICE
CERTIFICATE OF CORRECTION

| | | |
|---|---|---|
| PATENT NO. | : 9,666,343 B2 | Page 1 of 1 |
| APPLICATION NO. | : 15/242668 | |
| DATED | : May 30, 2017 | |
| INVENTOR(S) | : Michael John Disney Mallett | |

It is certified that error appears in the above-identified patent and that said Letters Patent is hereby corrected as shown below:

In the Claims

Column 6, Line 7, cancel the text beginning with "15. A method according" to and ending "based." at Line 10, and insert the following claim:

--15. A method according to claim 14 including conditioning the error signal by a PID function before providing the auxiliary current to the superconducting magnetic circuit.--

Signed and Sealed this
Seventh Day of November, 2017

Joseph Matal
*Performing the Functions and Duties of the*
*Under Secretary of Commerce for Intellectual Property and*
*Director of the United States Patent and Trademark Office*